US007345890B2

(12) United States Patent
DeNies et al.

(10) Patent No.: US 7,345,890 B2
(45) Date of Patent: Mar. 18, 2008

(54) ROTATING LATCHING MECHANISM FOR ATCA MEZZANINE CARD MODULES

(75) Inventors: Steven DeNies, East Aurora, NY (US); William Handley, Chandler, AZ (US); Mark D. Summers, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 320 days.

(21) Appl. No.: 11/096,398

(22) Filed: Apr. 1, 2005

(65) Prior Publication Data

US 2006/0221582 A1    Oct. 5, 2006

(51) Int. Cl.
*H05K 7/14* (2006.01)
(52) U.S. Cl. .................. 361/801; 361/683; 361/755
(58) Field of Classification Search ............... 361/683, 361/755, 801, 802
See application file for complete search history.

(56) References Cited

U.S. PATENT DOCUMENTS

| | | | | |
|---|---|---|---|---|
| 5,363,281 A | * | 11/1994 | Baitz et al. | 361/801 |
| 5,923,541 A | * | 7/1999 | Yasumi | 361/798 |
| 6,160,717 A | * | 12/2000 | Desousa et al. | 361/798 |
| 6,381,146 B1 | * | 4/2002 | Sevier | 361/754 |

* cited by examiner

*Primary Examiner*—Tuan T. Dinh
*Assistant Examiner*—Yuriy Semenenko
(74) *Attorney, Agent, or Firm*—Blakely, Sokoloff, Taylor & Zafman LLP

(57) ABSTRACT

Rotating latching mechanism for securing Advanced Telecom Computing Architecture (ATCA) mezzanine card (AdvancedMC) modules within mezzanine slots on an ATCA carrier board. The rotating latching mechanism includes a rotating latching member having a handle coupled to a shaft to which a latching paddle and position detector actuator paddle are also coupled. The rotating latching member is pivotally coupled relative to a faceplate of a module proximate to the handle, and the shaft at the opposite end is supported by a rear bearing support member coupled to the modules circuit card. As the handle is rotated, the latching paddle is rotated to engage a cutout formed in a strut coupled to the ATCA carrier board, thus latching the module in place. The position detector actuator paddle is also rotated to cause a position detector to be actuated.

8 Claims, 11 Drawing Sheets

ROTATING LATCHING MECHANISM FOR ATCA MEZZANINE CARD MODULES

FIELD OF THE INVENTION

The field of invention relates generally to computer and telecommunications equipment, and, more specifically but not exclusively relates to a latching mechanism for securing AdvancedMC modules on ATCA carrier boards.

BACKGROUND INFORMATION

The Advanced Telecom Computing Architecture (ATCA) (also referred to as AdvancedTCA) standard defines an open switch fabric based platform delivering an industry standard high performance, fault tolerant, and scalable solution for next generation telecommunications and data center equipment. The development of the ATCA standard is being carried out within the PCI Industrial Computer Manufacturers Group (PICMG). The ATCA Base Specification, PIGMG 3.0 Revision 1.0, published Dec. 30, 2002 (hereinafter referred to as "the ATCA specification") defines the physical and electrical characteristics of an off-the-shelf, modular chassis based on switch fabric connections between hot-swappable blades. The Advanced TCA base specification supports multiple fabric connections, and multi-protocol support (i.e., Ethernet, Fibre Channel, InfiniBand, StarFabic, PCI Express, and RapidIO) including the Advanced Switching (AS) technology.

The ATCA specification defines the frame (rack) and shelf (chassis) form factors, core backplane fabric connectivity, power, cooling, management interfaces, and the electromechanical specification of the ATCA-compliant boards. The electromechanical specification is based on the existing IEC60297 EuroCard form factor, and enables equipment from different vendors to be incorporated in a modular fashion and be guaranteed to operate. The ATCA specification also defines a power budget of 200 Watts (W) per board, enabling high performance servers with multi-processor architectures and multi gigabytes of on-board memory.

Recently, the modularity of the ATCA architecture has been extended to another level, wherein hot-swappable, field-replaceable mezzanine cards (or modules) may be hosted by an ATCA carrier board. Standards for the mezzanine cards/modules and related interfaces are defined by the Advanced Mezzanine Card (AdvancedMC) (also called AMC) specification, PIGMG AMC.0, Revision 1.0, published Jan. 3, 2005 (hereinafter referred to as the AMC.0 specification). Optimized for packet-based, high-availability telecom systems, AdvancedMC modules can be attached to a variety of ATCA and proprietary carrier blades. AdvancedMC modules communicate with the carrier board via a packet-based serial interface, which features up to 21 lanes of high-speed input/output (I/O) at 12.5 Gbit/sec each. The specification defines standard mezzanine module configuration for both full-height and half-height AdvancedMC modules, as well as modules employing single-width and double-width cards. AdvancedMC is slated to support a variety of protocols, including Ethernet, PCI Express, and Serial Rapid I/O. AdvancedMC also features integrated $I^2C$- and Ethernet-based system management. AdvancedMC modules may also be employed for non-ATCA systems.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIGS. 9a and 9b respectively show frontal isometric views of an AdvancedMC module being installed into an ATCA carrier board, wherein FIG. 9a shows the AdvancedMC module in an unlatched position, and FIG. 9b shows the AdvancedMC module in a latched position.

DETAILED DESCRIPTION

Embodiments of a rotating latch mechanism for installing mezzanine modules on carrier boards are described herein. In the following description, numerous specific details are set forth, such as implementations for Advanced Mezzanine Card (AdvancedMC) modules and Advanced Telecommunication Architecture (ATCA) carrier boards and chassis, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
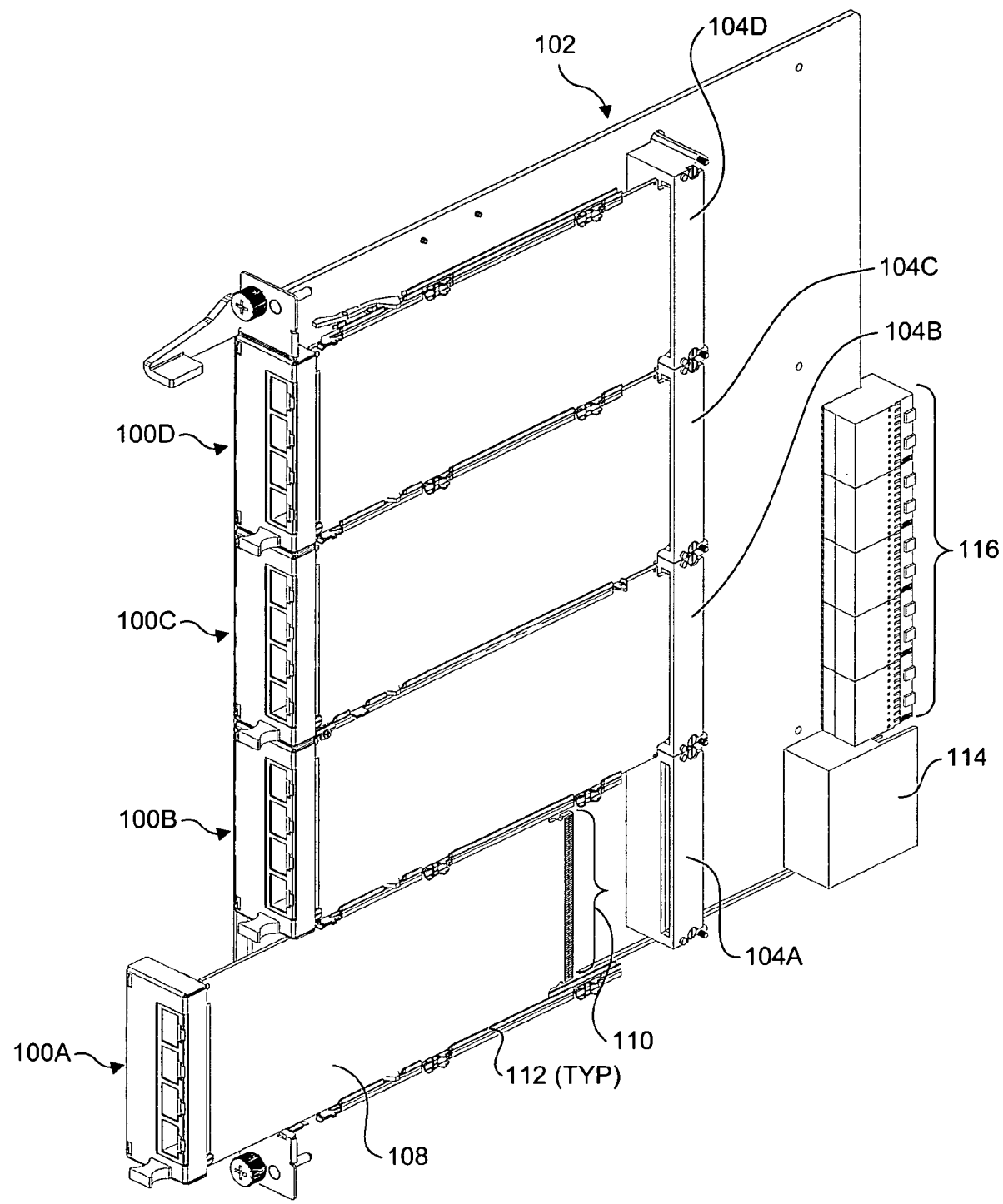
FIG. 1a is an isometric view of an Advanced Telecommunication Architecture (ATCA) carrier board to which four full-height single-width Advance Mezzanine Card (AdvancedMC) modules are coupled.

FIG. 1 shows an exemplary AdvancedMC module implementation wherein four single-width full-height AdvancedMC modules 100A, 100B, 100C, and 100D are installed on an ATCA carrier board 102. In general, ATCA carrier boards may have various configurations, depending on the number and type of AdvancedMC modules the carrier board is designed to host. For example, ATCA carrier board 102 includes four single-width full-height AdvancedMC connectors 104A, 104B, 104C, and 104D.

Figure 1B:
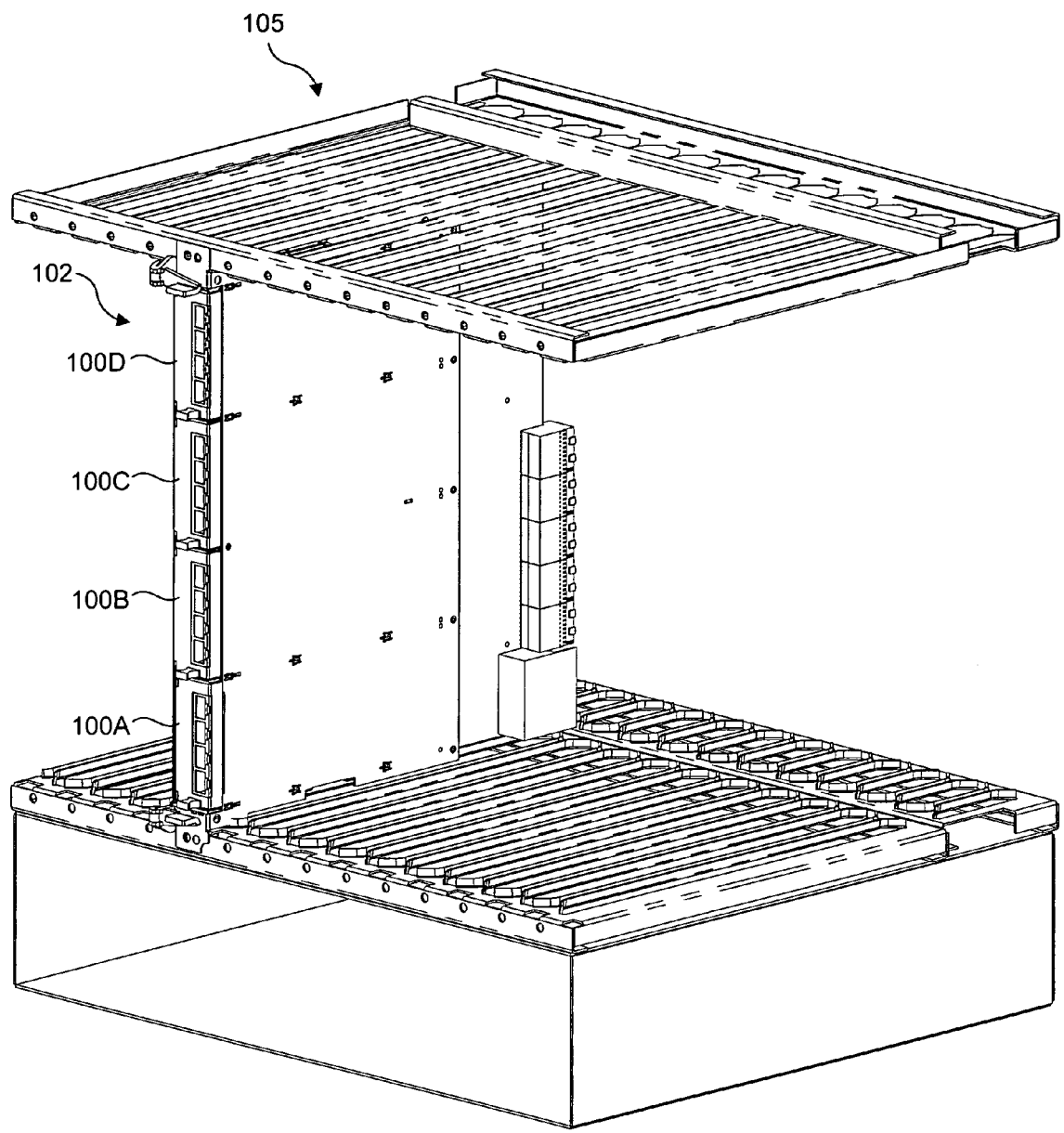
FIG. 1b shows an exemplary ATCA carrier board including four AdvancedMC modules installed in an ATCA chassis.

ATCA carrier boards (also referred to as simply ATCA boards), are configured to be installed in an ATCA chassis. For example, FIG. 1b shows an ATCA carrier board 102 installed in an ATCA chassis 105. For the purpose of simplicity and clarity, the backplane board and connector components for the ATCA chassis, as well as other components including cooling fans and ducting are not shown in FIG. 1b.

Figure 5A:
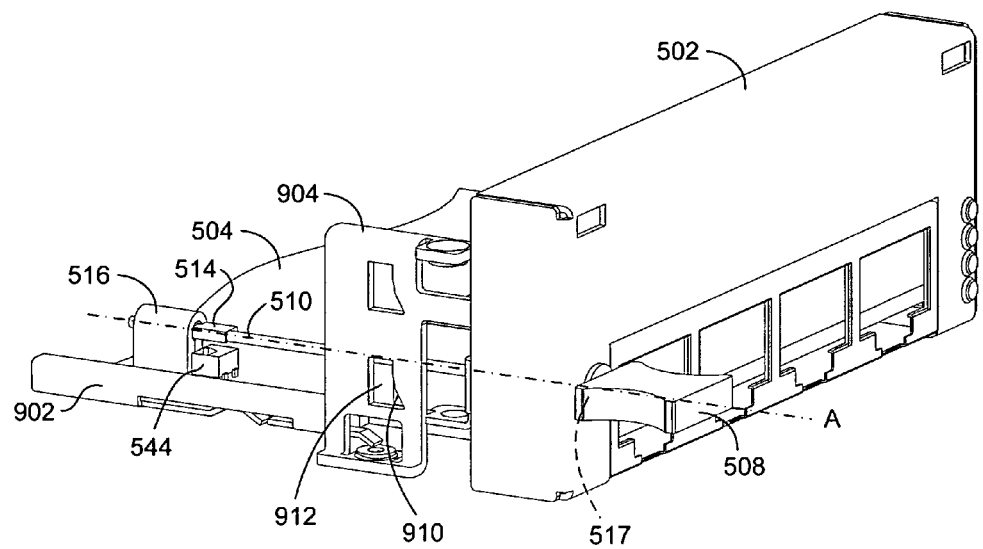
FIGS. 5a and 5b respectively show frontal isometric views of an AdvancedMC module including one embodiment of a rotating latching mechanism in an unlatched and latched configuration.

Under the AMC.0 specification, full-height AdvancedMC connectors are referred to as Style "B" (basic) or "B+" (extended) connectors. The term "basic" is associated with AdvancedMC connectors that are equipped with contacts on only one side of the connector slot. The term "+" identifies the connector as an extended connector having contacts on both sides of the connector slot. A single-width AdvancedMC module includes a single-width AdvancedMC card 108 having a single-width edge connector 110, further details of which are shown in FIG. 5a. As with its mating connector, a single-width edge connector may include contacts on a single side (basic) or both sides (extended).

The horizontal (or longitudinal) card edges of an AdvancedMC card are guided via a set of guide rails 112 disposed on opposing sides of the card. An ATCA carrier board also includes a power connector 114 via which power is provided to the carrier board from an ATCA chassis backplane, and various input/output (I/O) connectors 116 via which signals are routed to the backplane, and hence to other ATCA boards and/or AdvancedMC modules (mounted to other ATCA carrier boards) that are similarly coupled to the ATCA backplane.

Generally, the circuit components on an AdvancedMC module PCB card will be disposed on the side of the card facing the top or front side of the corresponding carrier board. This protects the circuitry, among other reasons for the configuration. To add further protection, an ATCA carrier board assembly will typically include a cover plate that is disposed over the backside of the AdvancedMC module PCB cards; the ATCA carrier board assemblies of FIGS. 1, 2, and 3, do not show the cover plate for clarity in illustrating how the PCB card edge connectors are mated to corresponding AdvancedMC connectors under a conventional implementation.

Figure 2:
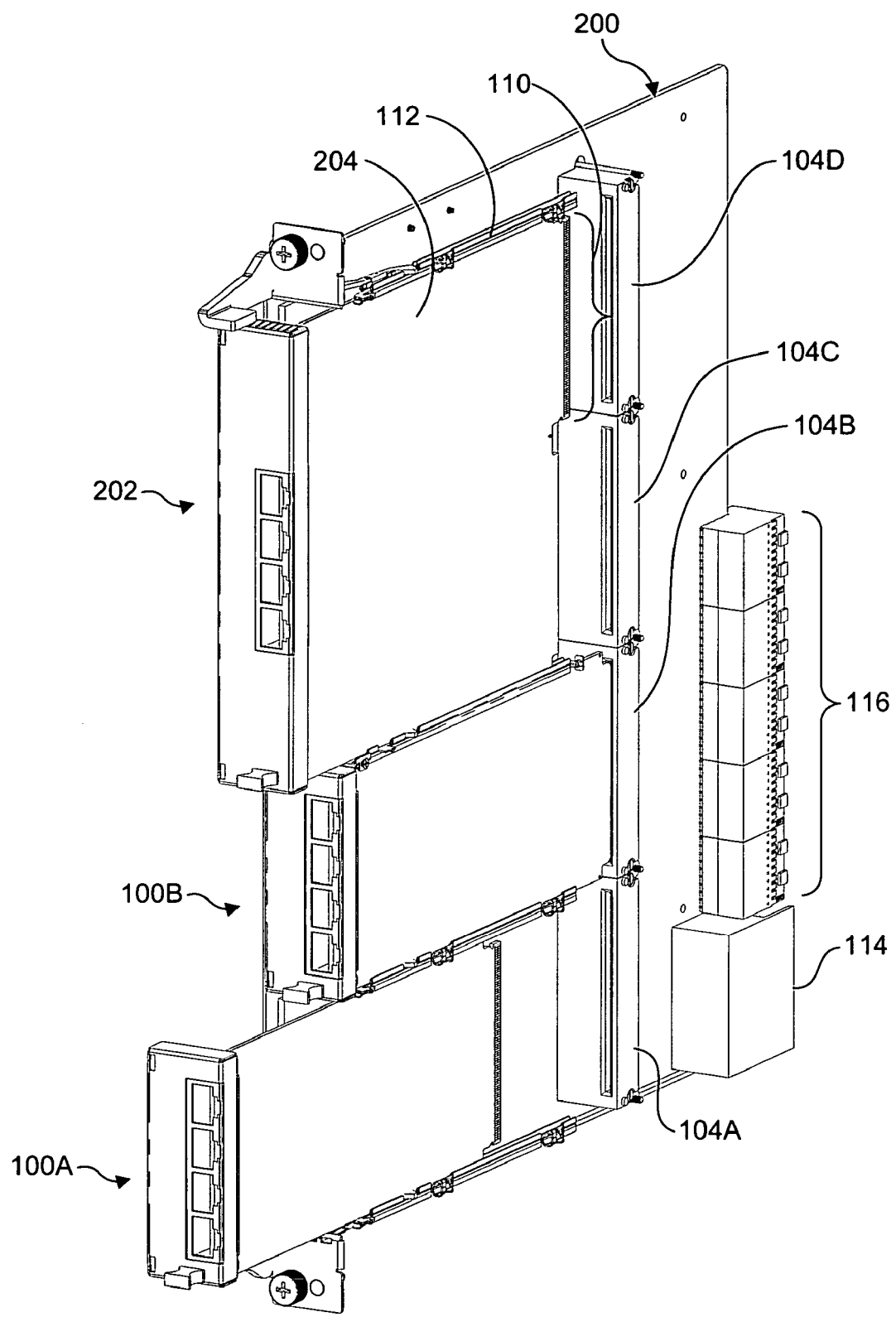
FIG. 2 is an isometric view of an ATCA carrier board to which to full-height single-width AdvancedMC modules and one conventional full-height double-width AdvancedMC module are coupled.

An ATCA carrier board 200 that supports a combination of single-width and double-width full-height AdvancedMC modules is shown in FIG. 2. As with the configuration of FIG. 1, ATCA carrier board 200 includes four full-height AdvancedMC connectors 104A, 104B, 104C, and 104D. Guide rails 112 are configured for receiving a pair of single-width full-height AdvancedMC modules 100A and 100B, as well as a double-width full-height AdvancedMC module 202. A double-width full-height module includes a double-width PCB card 204 including a single edge connector 110, as shown in FIG. 2. Thus, when a conventional double-width full-height AdvancedMC module is installed, it is coupled to a single single-width full-height AdvancedMC connector 104.

Figure 3:
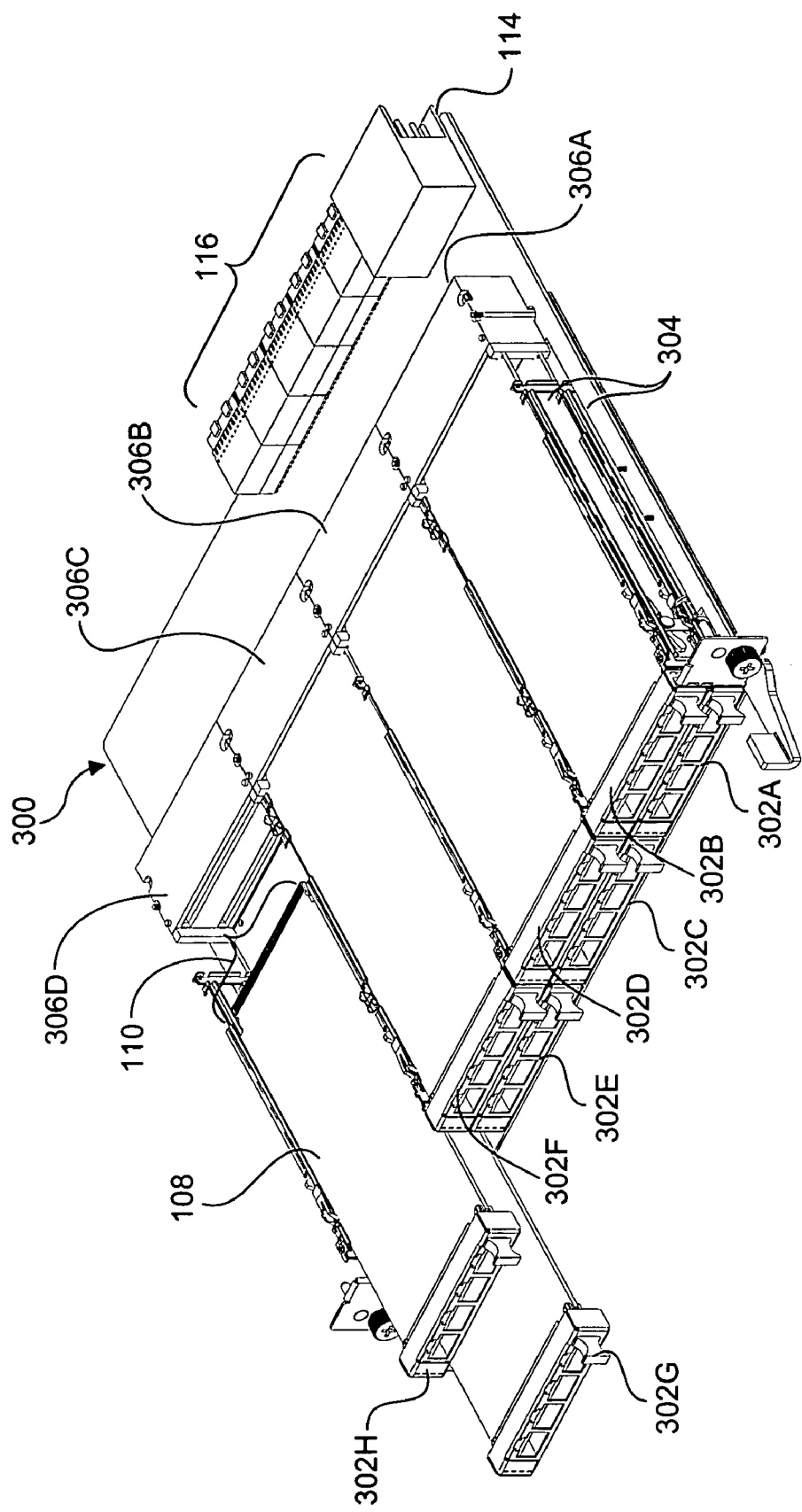
FIG. 3 is an isometric view of an ATCA carrier board to which to eight half-height single-width AdvancedMC modules are coupled.

In addition to full-height AdvancedMC modules, the AMC.0 specification defines use of single- and double-width half-height modules that may be stacked in a pair-wise manner that supports up to eight single-width, half-height modules. For example, such a configuration is shown in FIG. 3, which includes an ATCA carrier board 300 configured to support eight single-width single height AdvancedMC modules 302A, 302B, 302C, 302D, 302E, 302F, 302G, 302H. The configuration of a single-width board is the same whether it is used in a half-height or full-height AdvancedMC module. In the case of half-height modules, sets of dual-height rails 304 are employed to guide the card edges of each module.

ATCA carrier board 300 includes four AdvancedMC connectors 306A, 306B, 306C, and 306D. Each AdvancedMC connector has one of two possible configurations, referred to as style "AB" (for single-sided connections), and style A+B+ (for double sided connections). The lower connector slot on a AdvancedMC connector is referred to as slot "A", while the upper connector slot is referred to as slot "B," hence the names "AB" and "A+B+."

Figure 4:
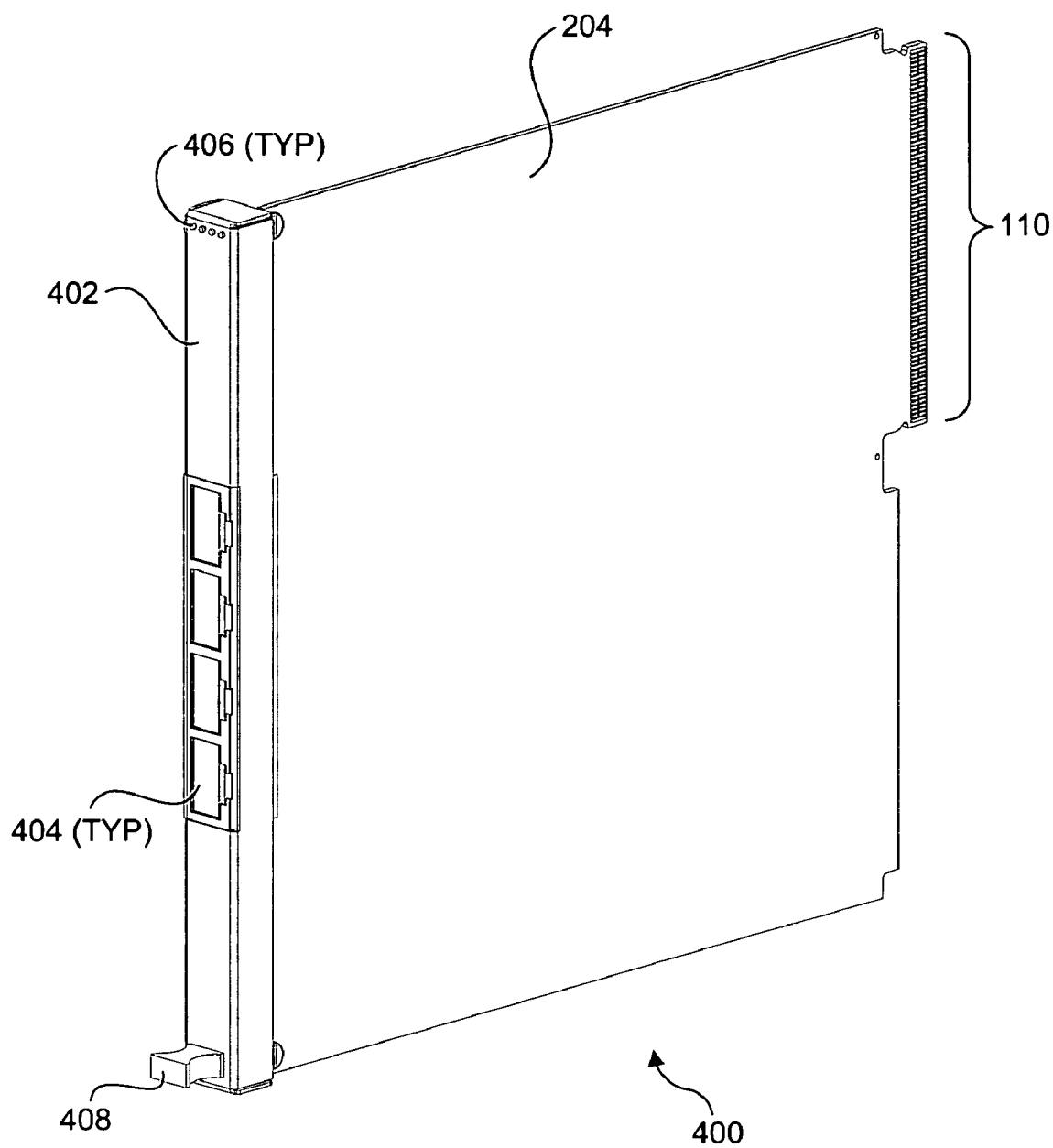
FIG. 4 is an isometric view of a conventional half-height double-width AdvancedMC module.

An example of a conventional half-height double-width AdvancedMC module 400 is shown in FIG. 4. The module includes a double-width PCB board 204 with a single edge connector 110; as with single-width modules, the configuration of a double-width PCB card is the same whether it is used in a half-height or full-height AdvancedMC module. The module 400 further includes a half-height front panel 402 (also referred to as a "face plate") coupled to PCB card 204. The front panel may generally include provisions for various input/output (I/O) ports via which external devices may communicate with a module. For illustrative purposes, FIG. 4 shows four RJ-45 Ethernet jacks 404. Various other types of I/O ports may also be employed, including, but not limited to universal serial bus (USB) ports, serial ports, infared ports, and IEEE 1394 ports. (It is noted that mechanical interface for each port is typically coupled to the PCB card, with an appropriately-sized aperture defined in the front panel). A front panel may also include various indicators, such as light-emitting diodes (LEDs) 406, for example, as well as input switches (not shown). In addition, a front panel will typically include a handle or similar means for grasping a module when it is being installed or removed from a carrier board, such as depicted by a handle 408.

As discussed above, AMC.0 specification defines provisions to support hot-swapping AdvancedMC modules. In order to perform hot swap operations, a power removal sequence is performed. In further detail, in connection with module extraction, power is removed under a predetermined sequence that requires an operator to perform a corresponding sequence of operations. A similar predetermined operator and power activation sequence is performed during module insertion.

Under one current implementation, a complicated mechanism is employed for determining the position of the module during hot-swap operations, and for securing the module in place. This implementation has several problems. First, an operator or passing personnel may inadvertently brush or hit the handle on a module, which may cause and AdvancedMC module to become partially extracted. This may either cause a power-down sequence to be initiated, or worse yet, may cause the module's edge connectors to disengage while power is being supplied. It is also somewhat difficult to perform the module extraction and insertion sequence in the proper manner using the mechanism. Additionally, the mechanism provides an impediment for cooling the module.

In accordance with aspects of the embodiments now described, an improved latching mechanism is provided. The latching mechanism employs a detent-type feedback to positively inform an operator of the position of the module. Embodiments of the latching mechanism also requires the operator to physically perform a predefined sequence when installing or extracting a module. In connection with this sequence, corresponding power operations to support module installation or extraction are performed in a fail-safe manner.

Various aspects of one embodiment of a rotating latching mechanism implemented for an AdvancedMC full-height single width module 500 are shown in FIGS. 5a-b, 6a-b, and 7a-c. AdvancedMC module 500 includes a faceplate 502 coupled to a single-width AdvancedMC card 504, which is shown in a partial cutaway view for illustrative purposes. The latching mechanism employs a rotating latching member 506, including a handle 508 and a shaft 510 passing through front panel 502. The rotating latching member 506 further includes a latching paddle 512 and a position detector actuator paddle 514.

At its front end, shaft 510 of rotating latching member 506 is supported by a bearing-type support defined in faceplate 502, while the opposing end of shaft 510 is supported by a rear shaft support member 516, thus enabling the rotating latching member to pivot about an axis A that is substantially perpendicular to a plane defining the front face of faceplate 502. In one embodiment, a bearing member having an internal plain bearing is coupled to faceplate 502. For example, a Keensert® or Pemnut® may be installed into an appropriately-sized hole in the faceplate. The threads of the Keensert® or Pemnut® could then be drilled out to form the internal bearing surface. Optionally, the internal bearing surface may be formed prior to installation, either by modifying an existing configuration, or employing a pre-manufactured component designed for this purpose. In another embodiment, a flanged bearing made of an appropriate material, such as plastic or bronze, is installed in faceplate 502.

Figure 8A:
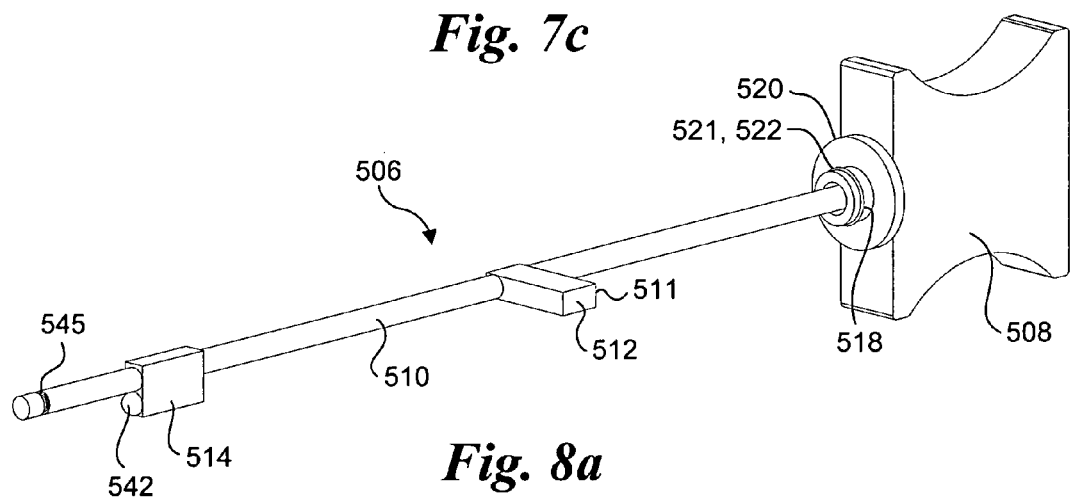
FIGS. 8a and 8b show respective embodiments of the rotating latching member employed by the rotating latching mechanisms illustrated in FIGS. 5a-b and 6a-b.
Figure 8B:
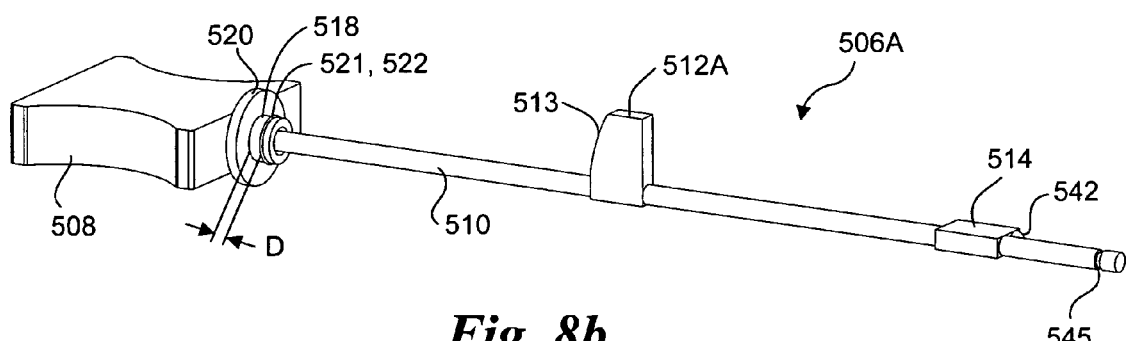

In yet another embodiment, a hole 517 is defined in faceplate 502, and rotating latching member 506 includes a collar 518, as shown in FIGS. 8a and 8b. The cylindrical surface of collar 518 functions as a shaft that rotates within a plain bearing function provided by hole 517. As further shown in FIGS. 8a and 8b, one embodiment of rotating latching member 506 includes a build-in flange 520. Flange 520 is used to transfer an input force applied to handle 508 to faceplate 502, such that when an operator installs AdvancedMC module 500 into a slot in an ATCA carrier board, the installation force is distributed across the faceplate rather than rear shaft support member 516.

In one embodiment, rotating latching member 506 further includes a locking ring 521 that resides within an appropriately-sized groove 522 (covered by locking ring 521 in the figures herein) defined in collar 518. For example, locking ring 521 may comprise a snap-ring such as a C-ring or E-ring or the like. During manufacture, collar 518 is inserted into its mating hole 517 in faceplate 502. The distance D between the front surface of flange 520 and beginning of groove 522 is slightly greater than the thickness of the faceplate material. The locking ring 521 is then snapped into grove 522, thus encapsulating a portion of faceplate 502 between the rear surface of locking ring 521 and the front surface of flange 520. Under this configuration, when the operator pulls outward on handle 508, the force is transferred to faceplate 502 via locking ring 521.

Figure 7A:
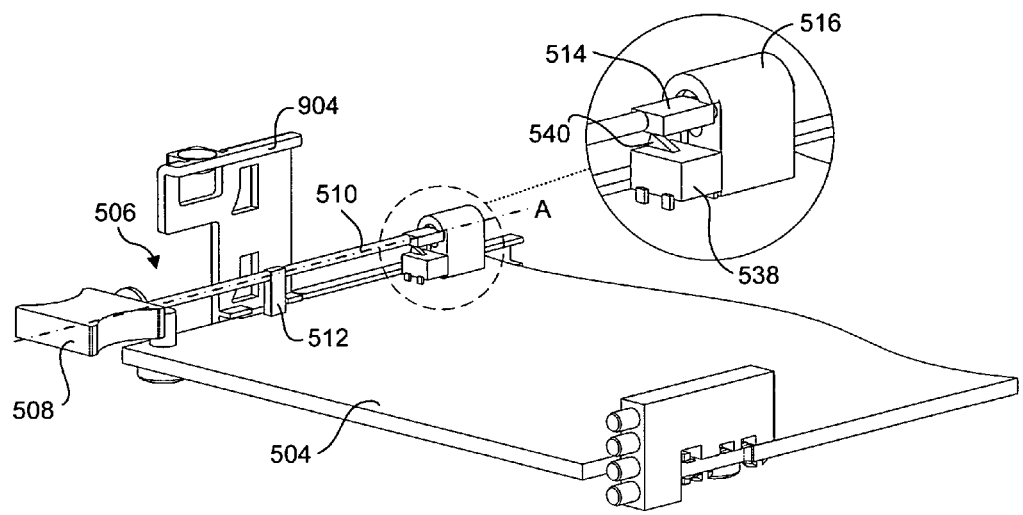
FIGS. 7a and 7b respectively show isometric detail views of the rotating latching mechanism in an unlatched and latched configuration.
Figure 7B:
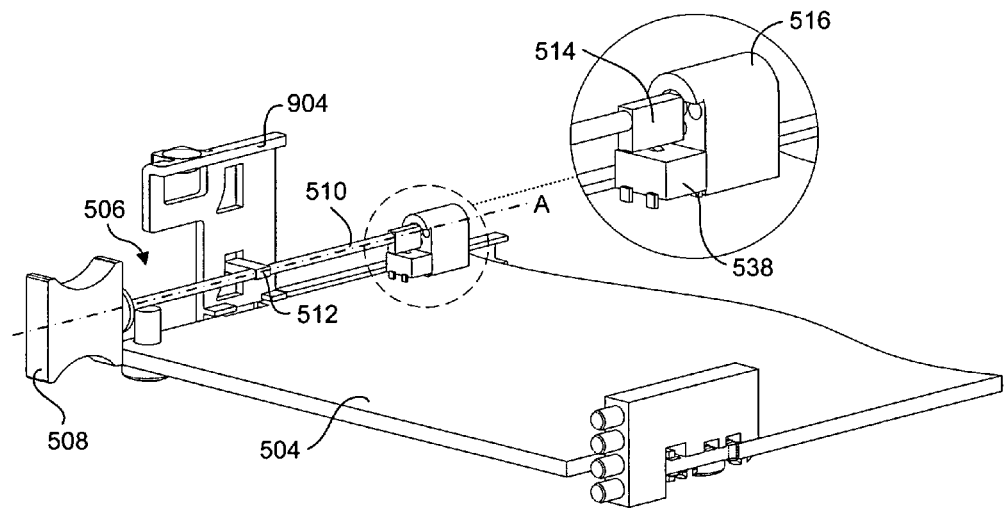
Figure 7C:
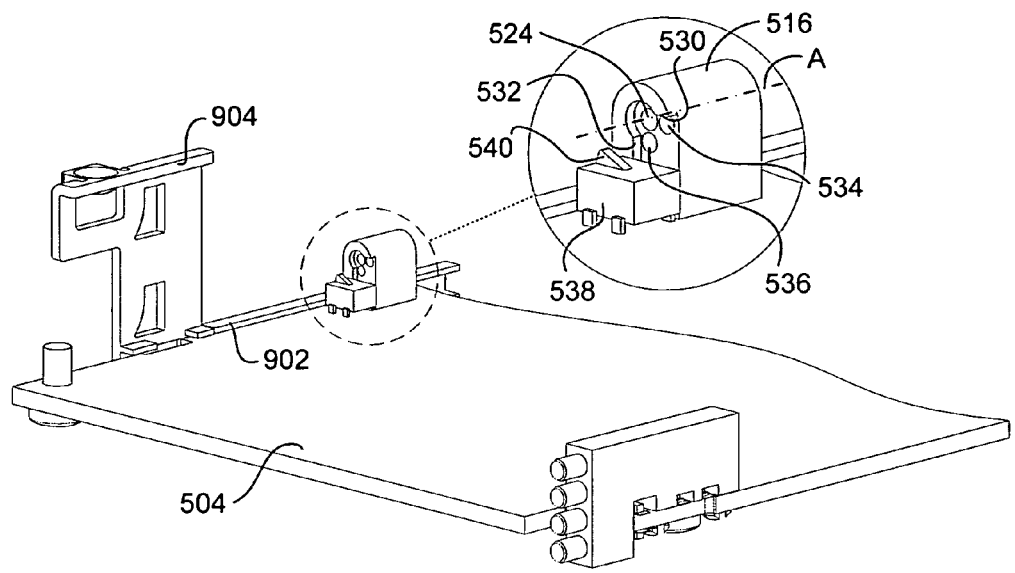
FIG. 7c shows an isometric view of the rotating latching mechanism illustrating further detail of the rear bearing support member.

Further details of one embodiment of rear bearing support member 516 are shown in FIGS. 7a-c. The support member includes a bore 524 formed along axis A, which functions as a plain bearing supporting the cantilevered end of shaft 510. A recessed surface 528 is formed in the support member to define a pair of endstops 530 and 532. A pair of detent pockets 534 and 536 are also formed in recessed surface 528.

Figure 9A:
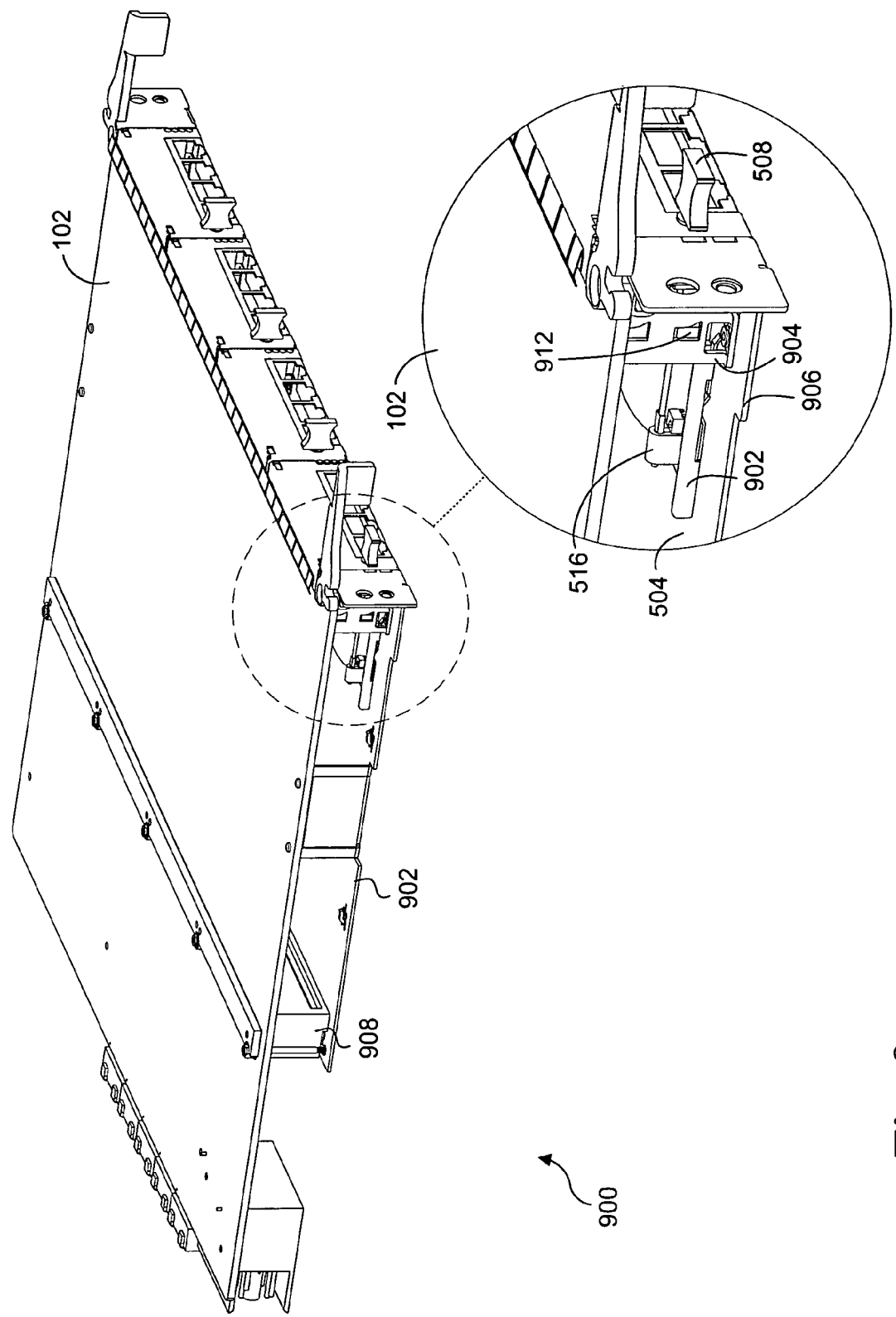
Figure 9B:
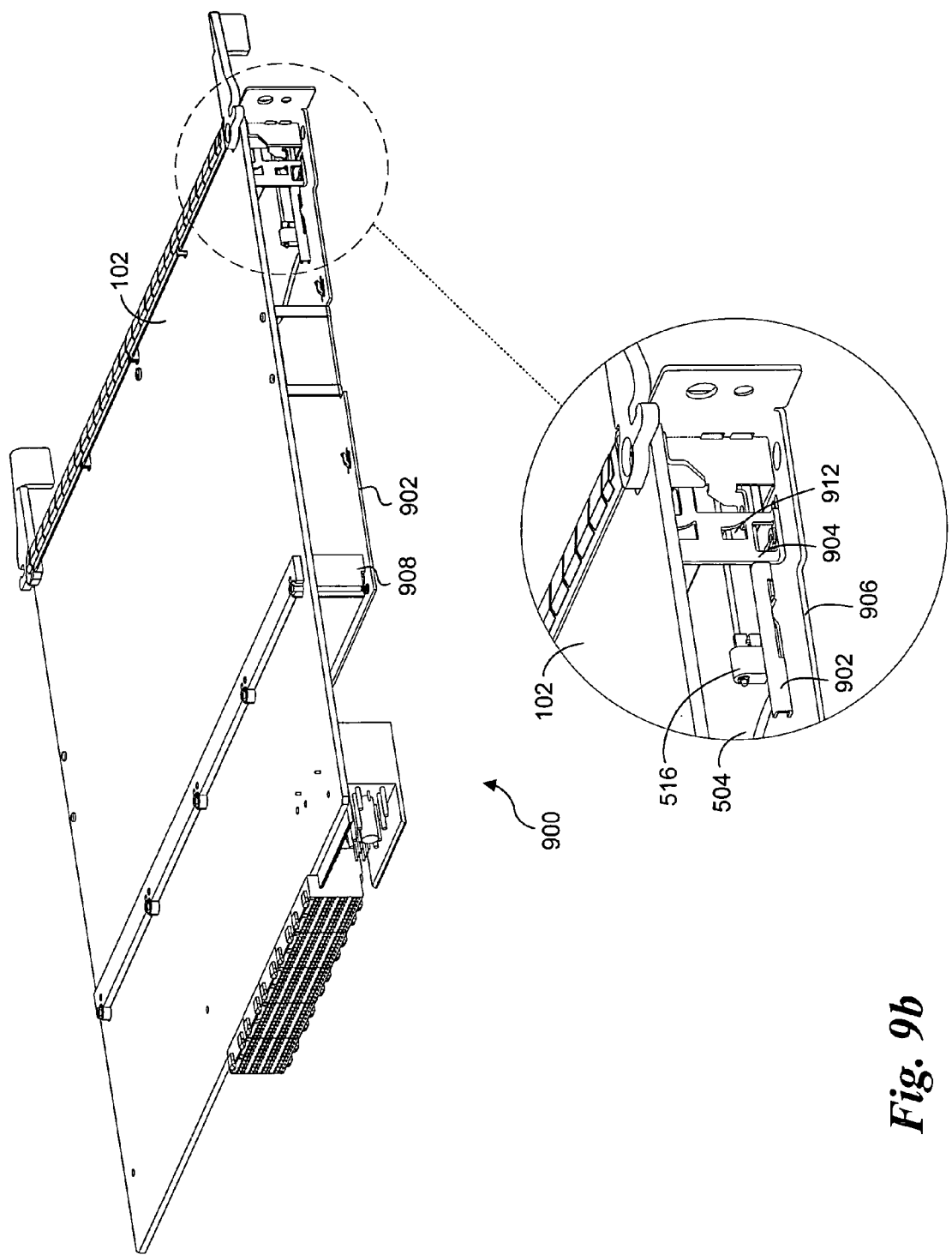

Operation of the rotating latching mechanism proceeds as follows. First, an operator slides the rear portion of AdvancedMC module 500 into a mezzanine slot in the ATCA board. For example, an exemplary ATCA board 900 having slots for four single-width full-height AdvancedMC modules is shown in FIGS. 9a and 9b. The edges of the single-width card 504 slide within a set of rails, as discussed above with reference to Figure 1a. One such rail 902 is depicted in FIGS. 9a and 9b. Each slot also includes a strut 904 that is coupled between an ATCA carrier board 102 and a cover plate 906. For illustrative purposes, strut 904 and rail 902 are also shown in each of FIGS. 6a-b, 7a-b, and 9a-c; however, it will be understood that strut 904 and rail 902 are actually part of the ATCA carrier board assembly and are not components of an AdvancedMC module.

Figure 5B:
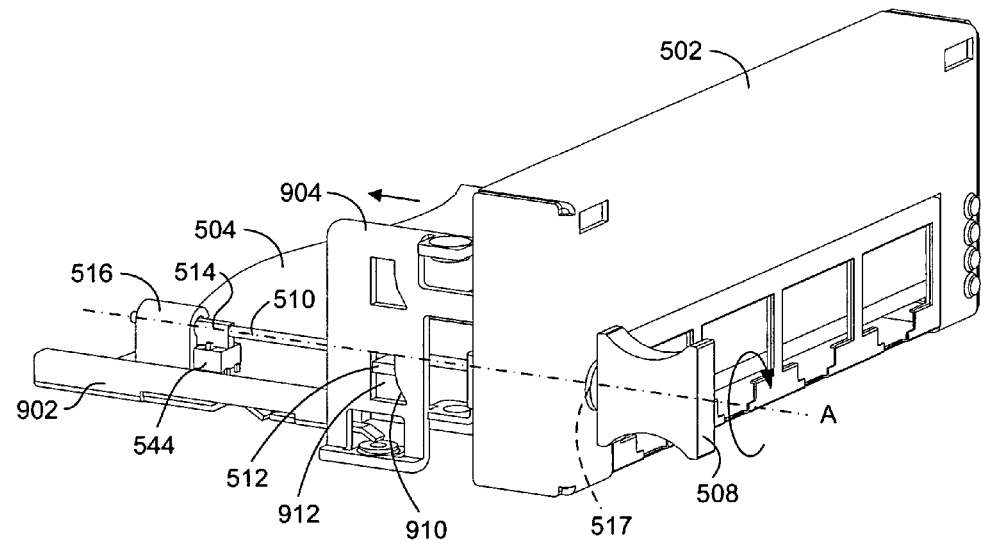
Figure 6A:
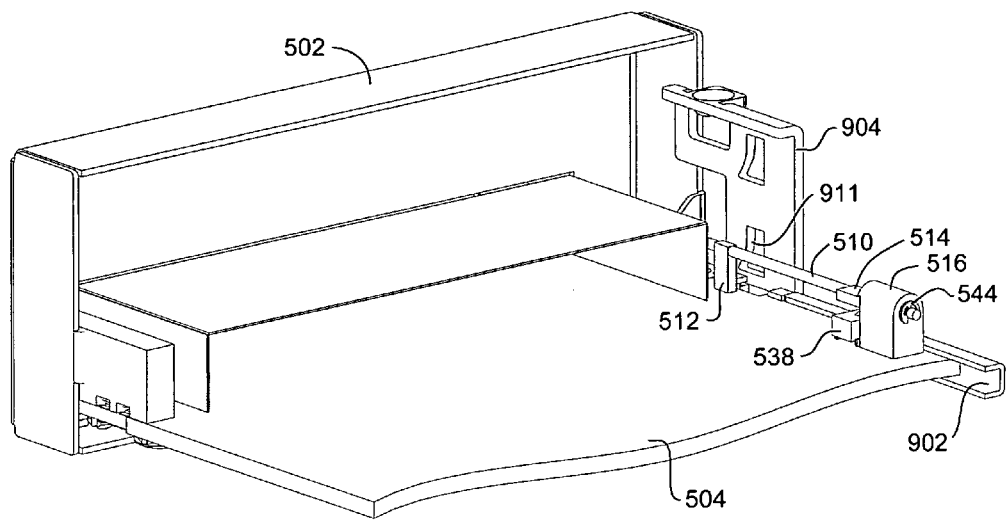
FIGS. 6a and 6b respectively show rear isometric views of the AdvancedMC module of FIGS. 5a and 5b, with the rotating latching mechanism in an unlatched and latched configuration.

FIGS. 5a and 6a illustrate frontal and rear isometric views of AdvancedMC 500 upon the operator sliding the module into a slot. In one implementation, the operator slides the module to the rear of the slot, but doesn't fully couple card 504's edge connector (not shown) with a mating AdvancedMC connector 908 (FIGS. 9a-b). The operator then rotates handle 508 clockwise, as shown in FIG. 5b. As the handle 508 (and the rest of rotating latching member 506) is rotated clockwise, an edge 511 of latching paddle 512 engages a forward arcuate-shaped edge 910 of a cutout 912 formed in strut 904. As handle 508 is further rotated, latching paddle edge 511 slides along cutout edge 910, causing the module to be moved rearward, thus coupling card 504's edge connector within its mating AdvancedMC connector 908.

In another embodiment of a rotating latching member 506A shown in FIG. 8b, a latching paddle 512A having an arcuate-shaped edge 513 is employed. In this configuration, strut 904 may employ rectangular slots in place of arcuate-shaped cutouts 912. The net result is the same, with the module being urged rearward upon rotation of handle 508 by means of the engagement of arcuate-shaped edge 513 with a mating edge of a rectangular slot.

In another embodiment (not illustrated) each of the latching paddle and the cutouts in strut 904 are rectangular in shape. Under this embodiment, it is not possible to rotate handle 508 to its secure latched position (depicted in FIGS. 5b and 7b and 9b) unless card 504's edge connector is fully seated within AdvancedMC connector 908.

Another feature of the rotating latching mechanisms described herein is a position detection function. In one embodiment, this is facilitated by a microswitch 538 mounted on card 504. The microswitch 538 includes an actuator 540 that is employed to de-actuate and actuate microswitch 538 via rotation of position detector actuator paddle 514, as depicted in FIGS. 7a and 7b, respectively. In other embodiments, other position-type sensors may be used, such as proximity switches (e.g., capacitive, magnetic, hall-effect, etc.), which are well-known in the art. In such implementations, the proximity switch is caused to be actuated when position detector actuator paddle 514 is rotated proximate to the sensor of the proximity switch.

Yet another feature of the rotating latching mechanisms is a positive detent action. This provides feedback to the operator to inform him or her that the handle is rotated to a corresponding position. It also serves the function of preventing a latched handle from being inadvertently moved to an unlatched position.

As shown in FIGS. 8a and 8b, each of rotating latching members 506 and 506A include a detent ball 542 formed in their respective position detector actuator paddle 542. When handle 508 is rotated to the unlatched position depicted in FIGS. 5a, 7a, and 9a, detent ball 542 resides within detent pocket 534. When handle 508 is rotated to the latched position depicted in FIGS. 5b, 7b, and 9b, detent ball 542 resides within detent pocket 536. The travel limits 530 and 532 prevent handle 508 (and thus the rotating latching member 506) from being rotated at an angle beyond the normal operation range. This enables circuit components to be placed proximate to latching paddle 512 without worrying about the latching paddle interfering with such components.

Figure 6B:
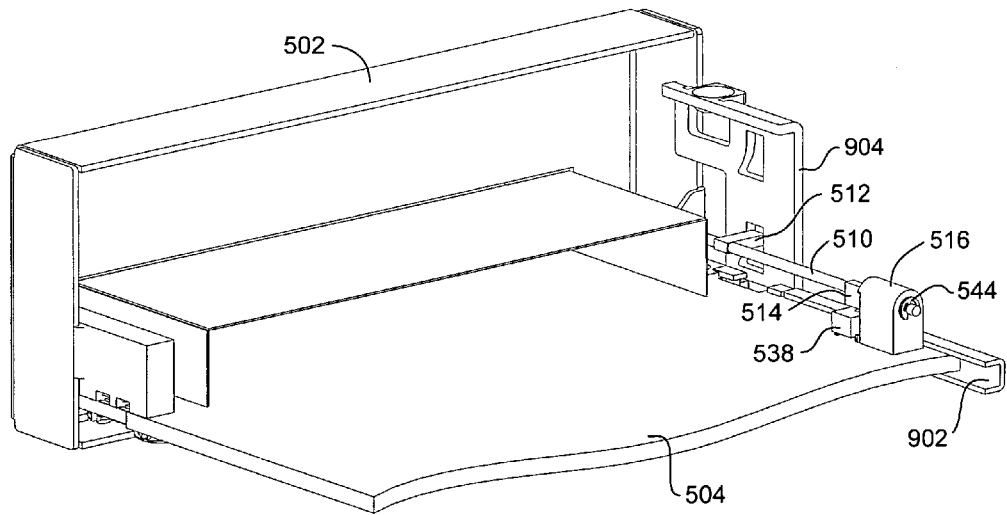

In one embodiment, a locking ring such as the E-ring 544 depicted in FIGS. 6a and 6b is disposed within a mating groove 545 formed in shaft 510. Under this configuration, rear bearing support member 516 is encapsulated between detent ball 542 and the rear surface of the locking ring. This ensures a sufficient torque is required to rotate the rotating latching member out of a detent position.

As described above, in one embodiment handle 508 is pivotally-coupled to faceplate 502 such that when an operator pushes or pulls on the handle the push or pulling force is transferred to the faceplate. To facilitate this configuration, it is necessary that handle 508 and shaft 510 be separated prior to assembly (e.g., since the latching paddle 512 will not fit thought hole 517 in faceplate 502). In one embodiment, shaft 510 is threaded into handle 508 during an assembly operation, and secured with a thread fastener adhesive, such as manufactured by the Loctite® corporation. This threaded configuration further serves the function of enabling the location of rear bearing support member 516 to vary relative to faceplate 502 upon assembly of card 504 to the faceplate, thus loosening manufacturing tolerances.

Implementation of the rotating latching mechanism provides several advantages over the current mechanism employed for latching AdvancedMC modules in ATCA carrier boards. One such advantage is that inadvertent partial extraction (and thus non-availability) of a module is greatly reduced. In order to extract a module, the handle must first be rotated out of a detent position. At this point, the module can then be pulled out. This further aids in implementing the power removal cycle required by the AMC.0 specification. In response to initial rotation of the handle out of the latched position, the position detector senses the movement of the handle, which initiates the power removal cycle. Since it takes a finite amount of time to rotate the handle to the unlatched position, the power removal cycle may be completed prior to enabling the operator to remove the AdvancedMC module. Similarly, during installation, microswitch 538 cannot be activated until (and unless) the AdvancedMC module is secured in the latched position. Accordingly, logic may be easily implemented such that power will not be provided to the module unless it is securely latched in its slot.

Yet another advantage relates to cooling the module's components. Unlike with the currently latching mechanism, the relatively thin profile of the rotating latching member employed in the embodiments described herein provides little impediment to airflow across a module's card and associated circuit components.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. An module comprising:
   a circuit card;
   a faceplate attached to the circuit card;
   a rotating latching member, pivotally-coupled to rotate about an axis substantially perpendicular to a front face of the faceplate, and including,
      a shaft having first and second ends;
      a handle, coupled to the first end of the shaft; and
      a latching paddle, coupled to the shaft;
   a rear bearing support member mounted on the circuit card, to support the second end of the shaft; and
   a pivotal coupling to pivotally couple the rotating latching member to the faceplate such that application of each of a push force and a pull force upon the handle is transferred to the faceplate via the pivotal coupling, the pivotal coupling comprising:
      a flange, coupled to the handle and disposed on a front side of the faceplate; and
      a locking ring, coupled to the shaft and disposed in groove proximate to a back side of the faceplate.

2. The module of claim 1, further comprising:
   a position detector actuator paddle, coupled to the shaft; and
   a position detector, operatively coupled to the circuit card, wherein rotation of the rotating latching member to a latched position causes the position detector actuator paddle to actuate the position detector.

3. The module of claim 2, wherein the position detector comprises a microswitch.

4. The module of claim 2, wherein the position detector comprises a proximity switch.

5. The module of claim 1, further comprising a detent mechanism providing a first detent position when the latching paddle is rotated to an unlatched position and a second detent position when the latching paddle is rotated to a latched position.

6. The module of claim 5, wherein the detent mechanism comprises:
   a detent ball, operatively coupled to the shaft; and
   first and second detent pockets, formed in a face of the rear bearing support member,
   wherein the detent ball engages with the first detent pocket when the latching paddle is rotated to the unlatched position, and the detent ball engages with the second detent pocket when the latching paddle is rotated in the latched position.

7. The module of claim 1, further comprising a rotational travel limit mechanism to limit rotation of the rotating latching member between first and second angles.

8. The module of claim 1, wherein the latching paddle includes an arcuate shaped edge.

* * * * *